US011226568B2

(12) United States Patent
Van Dongen et al.

(10) Patent No.: US 11,226,568 B2
(45) Date of Patent: Jan. 18, 2022

(54) LITHOGRAPHIC APPARATUS AND METHOD

(71) Applicant: ASML Netherlands B.V., Veldhoven (NL)

(72) Inventors: Paul Van Dongen, Eindhoven (NL); Aart Adrianus Van Beuzekom, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/762,589

(22) PCT Filed: Sep. 27, 2018

(86) PCT No.: PCT/EP2018/076213
§ 371 (c)(1),
(2) Date: May 8, 2020

(87) PCT Pub. No.: WO2019/091662
PCT Pub. Date: May 16, 2019

(65) Prior Publication Data
US 2020/0393770 A1 Dec. 17, 2020

(30) Foreign Application Priority Data
Nov. 9, 2017 (EP) .................................. 17200872

(51) Int. Cl.
G03F 7/20 (2006.01)
H01L 21/673 (2006.01)
(Continued)

(52) U.S. Cl.
CPC ........ *G03F 7/70916* (2013.01); *G03F 7/7075* (2013.01); *G03F 7/70466* (2013.01);
(Continued)

(58) Field of Classification Search
CPC ............. G03F 7/70466; G03F 7/70475; G03F 7/7075; G03F 7/70866; G03F 7/70916;
(Continued)

(56) References Cited

U.S. PATENT DOCUMENTS 6,406,834 B1* 6/2002 Kuit ..................... G03F 7/70466
430/311
9,105,673 B2* 8/2015 Babbs ............... H01L 21/67213
(Continued)

FOREIGN PATENT DOCUMENTS

EP     1 059 565 A2   12/2000
JP     H03 46317 A     2/1991
JP     2007 165778 A   6/2007

OTHER PUBLICATIONS

International Search Report and Written Opinion of the International Searching Authority directed to related International Patent Application No. PCT/EP2018/076213, dated Jan. 4, 2019; 9 pages.
(Continued)

*Primary Examiner* — Colin W Kreutzer
(74) *Attorney, Agent, or Firm* — Sterne, Kessler, Goldstein & Fox P.L.L.C.

(57) ABSTRACT

A lithographic apparatus comprising a substrate storage module having a controllable environment for protecting lithographically exposed substrates from ambient air. The substrate storage module is configured to store at least twenty substrates and the substrate storage module is an integral part of the lithographic apparatus. The substrate storage module may be used to protect substrates from ambient air during stitched lithographic exposures.

17 Claims, 6 Drawing Sheets

(51) Int. Cl.
    *H01L 21/687* (2006.01)
    *H01L 21/677* (2006.01)
    *H01L 21/027* (2006.01)
(52) U.S. Cl.
    CPC ...... *G03F 7/70475* (2013.01); *G03F 7/70866* (2013.01); *G03F 7/70991* (2013.01); *H01L 21/67383* (2013.01); *H01L 21/67389* (2013.01); *H01L 21/67769* (2013.01); *H01L 21/67778* (2013.01); *H01L 21/68707* (2013.01); *H01L 21/0275* (2013.01)
(58) Field of Classification Search
    CPC ............. G03F 7/70991; H01L 21/0275; H01L 21/67383; H01L 21/67389; H01L 21/67769; H01L 21/67778; H01L 21/68707
    USPC .................. 355/30, 72, 77; 414/935–941
    See application file for complete search history.

(56) References Cited

U.S. PATENT DOCUMENTS

2006/0160268 A1    7/2006  Yamada
2013/0186803 A1*  7/2013  Zhang ............... H01L 21/67386
                                                             206/711

OTHER PUBLICATIONS

International Preliminary Report on Patentability directed to related International Patent Application No. PCT/EP2018/076213, dated May 12, 2020; 7 pages.

* cited by examiner

LITHOGRAPHIC APPARATUS AND METHOD

CROSS-REFERENCE TO RELATED APPLICATIONS

This application claims priority of EP application 17200872.4 which was filed on Nov. 9, 2017 and which is incorporated herein in its entirety by reference.

FIELD

The present invention relates to a lithographic apparatus and method for storing substrates.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

The maximum area of the patterning device that may be imaged onto the substrate using the lithographic apparatus (i.e. the maximum image area) may vary between different lithographic apparatus. For example, some lithographic apparatus may only be capable of imaging an area of the patterning device that is less than or equal to half of the maximum image area of other lithographic apparatus. A technique known as stitching may be used to overcome the limited maximum image area of some lithographic apparatus. Stitching includes performing at least two sub-exposures on neighboring areas of the substrate to form a combined image on a substrate. After a lithographic exposure is performed the substrate undergoes resist processing which includes, for example, a baking process. In the case of a stitched exposure, the baking process is postponed until each set of sub-exposures have taken place across all target areas of the substrate. Delays may arise between performing the first set of sub-exposures of the first substrate of the lot and performing a subsequent set of sub-exposures of the final substrate of the lot. Lithographically exposed resist on the substrate may be vulnerable to degradation during such delays.

It is desirable to provide, for example, a lithographic apparatus and method that obviates or mitigates one or more problems of the prior art, whether identified herein or elsewhere.

SUMMARY

According to a first aspect of the invention, there is provided a lithographic apparatus comprising a substrate storage module having a controllable environment for protecting lithographically exposed substrates from ambient air, the substrate storage module being configured to store at least twenty substrates, wherein the substrate storage module is an integral part of the lithographic apparatus.

The substrate storage module advantageously provides a space in which substrates may be stored and protected from negative effects caused by ambient air after a lithographic exposure. For example, the substrate storage module may protect substrates that have undergone a sub-exposure during a stitched lithographic exposure for an extended period of time. The substrate storage module advantageously stores at least twenty substrates making the substrate storage module suitable for storing substrates during a lithographic process involving twenty or more substrates. The term "integral part" is intended to indicate that the substrate storage module remains connected to the lithographic apparatus throughout operation of the lithographic apparatus (i.e. the substrate storage module cannot be removed from the lithographic apparatus unless the lithographic apparatus is switched off).

The substrate storage module may comprise a gas delivery system configured to provide a flow of gas within the substrate storage module.

The gas delivery system may comprise a filter.

The gas delivery system may comprise a heat exchanger.

The lithographic apparatus may further comprise a vacuum system configured to generate a vacuum within the substrate storage module.

The substrate storage module may comprise a plurality of slots for receiving substrates.

The slots may be stacked in a plurality of columns.

The substrate storage module may comprise a shield located between neighboring slots, the shield being configured to reduce the amount of debris transferring between stored substrates.

The substrate storage module may comprise an actuator configured to move the slots.

The lithographic apparatus may further comprise a robotic arm configured to receive an incoming substrate and place the incoming substrate in the substrate storage module, the robotic arm being further configured to retrieve an outgoing substrate from the substrate storage module and remove the outgoing substrate from the substrate storage module.

According to a second aspect of the invention, there is provided a lithographic apparatus comprising an illumination system configured to condition a radiation beam, a support structure constructed to support a patterning device, the patterning device being capable of imparting the radiation beam with a pattern in its cross-section to form a patterned radiation beam, a substrate table constructed to hold a substrate, a projection system configured to project the patterned radiation beam onto the substrate, and a substrate storage module having a controllable environment for protecting lithographically exposed substrates from ambient air, the substrate storage module being configured to store at least twenty substrates, wherein the substrate storage module is an integral part of the lithographic apparatus.

According to a third aspect of the invention, there is provided a method of exposing a plurality of substrates to form a stitched pattern on the substrates, the method comprising the following steps:

(a) performing a first set of sub-exposures on a substrate to form a partially exposed substrate;

(b) moving the partially exposed substrate to a substrate storage module having a controlled environment, the substrate storage module being configured to store at least twenty substrates, the substrate storage module being an integral part of the lithographic apparatus;

(c) repeating steps (a) and (b) for the remaining substrates; and, (d) removing the partially exposed substrates from the substrate storage module and performing a second set of sub-exposures on the partially exposed substrates to form substrates having stitched patterns.

The method may further comprise the following step:

(e) performing a baking process on the substrates having stitched patterns.

The may further comprise providing a flow of gas within the substrate storage module.

The method may further comprise filtering the flow of gas.

The method may further comprise controlling a temperature of the gas.

The method may further comprise controlling a humidity of the gas.

The method may further comprise controlling a concentration of amines in the gas.

The method may further comprise generating a vacuum within the substrate storage module.

According to a fourth aspect of the invention, there is provided a device manufactured according to the method of the third aspect of the invention, or any of its associated options.

BRIEF DESCRIPTION OF THE DRAWINGS

Embodiments of the invention will now be described, by way of example only, with reference to the accompanying schematic drawings, in which.

DETAILED DESCRIPTION

Figure 1:
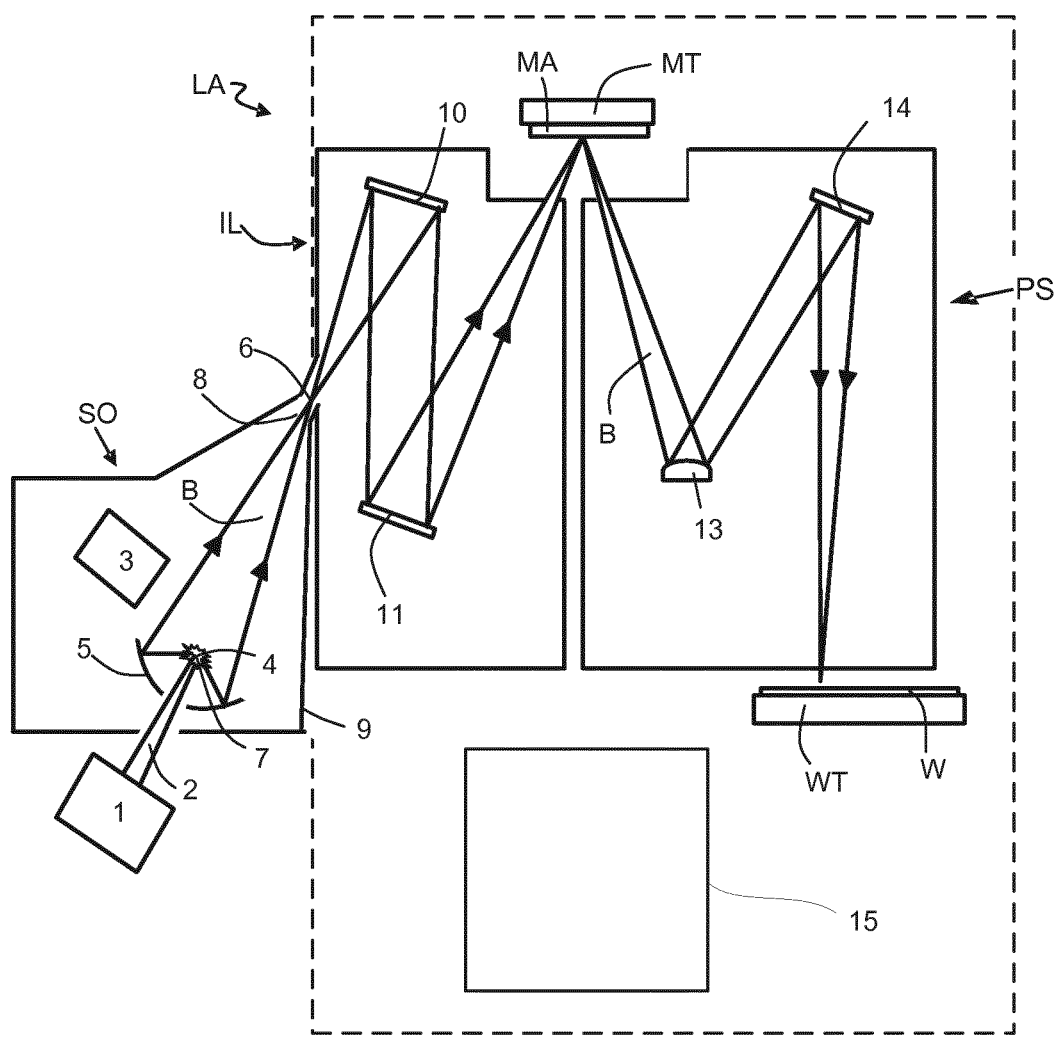
FIG. 1 schematically depicts a lithographic system comprising a lithographic apparatus, a radiation source and a substrate storage module according to an embodiment of the invention.

FIG. 1 shows a lithographic system including a substrate storage module 15 according to one embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system PS is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system PS comprises a plurality of mirrors 13, 14 which are configured to project the radiation beam B onto a substrate W held by the substrate table WT. The projection system PS may apply a reduction factor to the radiation beam B, forming an image with features that are smaller than corresponding features on the patterning device MA. A reduction factor of four may, for example, be applied. Although the projection system PS has two mirrors 13, 14 in FIG. 1, the projection system PS may include any number of mirrors (e.g. six mirrors).

The radiation sources SO shown in FIG. 1 may include components which are not illustrated. For example, a spectral filter may be provided in the radiation source SO. The spectral filter may be substantially transmissive for EUV radiation but substantially blocking for other wavelengths of radiation such as infrared radiation.

Figure 2:
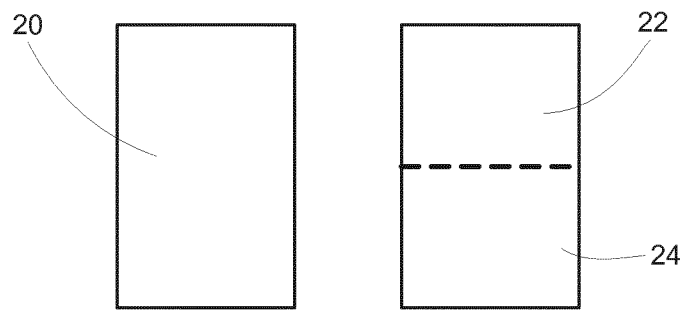
FIG. 2 schematically depicts a maximum image area of a first lithographic apparatus compared with two maximum image areas of a second lithographic apparatus.

As discussed above, some lithographic apparatus may be used to perform stitched lithographic exposures in which at least two sub-exposures take place on neighboring areas of the substrate to image a desired area of the patterning device onto the substrate. FIG. 2 schematically depicts a maximum image area 20 of a first lithographic apparatus compared with two maximum image areas 22, 24 of a second lithographic apparatus. In the example of FIG. 2, the maximum image area 22, 24 of the second lithographic apparatus is half of the maximum image area 20 of the first lithographic apparatus. Whereas the first lithographic apparatus required one exposure 20 to image the desired area onto the substrate, the second lithographic apparatus required two sub-exposures 22, 24 to image the same desired area onto the substrate. In the case of the second lithographic apparatus, a first sub-exposure 22 is performed using a first area of the patterning device then a second sub-exposure 24 is performed either using a different area of the patterning device or using a different patterning device. The second sub-exposure 24 takes place on a neighboring area of the substrate such that the image formed on the substrate is equivalent to the image 20 formed using the first lithographic apparatus. Other lithographic apparatus may have a smaller maximum image area than the second lithographic apparatus. For example, other lithographic apparatus may have a maximum image area that is a third of the maximum image area 20 of the first lithographic apparatus. In this case, three sub-exposures may be performed such that the image formed on the substrate is equivalent to the image 20 formed using the first lithographic apparatus.

After a lithographic exposure has been performed, the substrate may undergo resist processing which may, for example, include a baking process. In the case of a stitched exposure, the baking process is postponed until each sub-exposure has taken place across all target areas of the substrate. In some lithographic processes, the baking process may not begin until all substrates of a substrate lot (e.g. about twenty-five substrates) have undergone the stitched exposure. If the baking process takes place for an entire lot of substrates, then long delays (e.g. between five and ten minutes) may arise between performing the first set of sub-exposures on the first substrate of the lot and performing the final set of sub-exposures on the final substrate of the lot.

A delay between performing an exposure and baking the substrate may negatively affect the structures that are to be formed on the substrate due, at least in part, to interactions between the resist on the substrate and the ambient air in which the substrate is held. In general, the longer a lithographically exposed substrate is held in ambient air, the worse the quality of the structures formed on the substrate will be.

Figure 3:
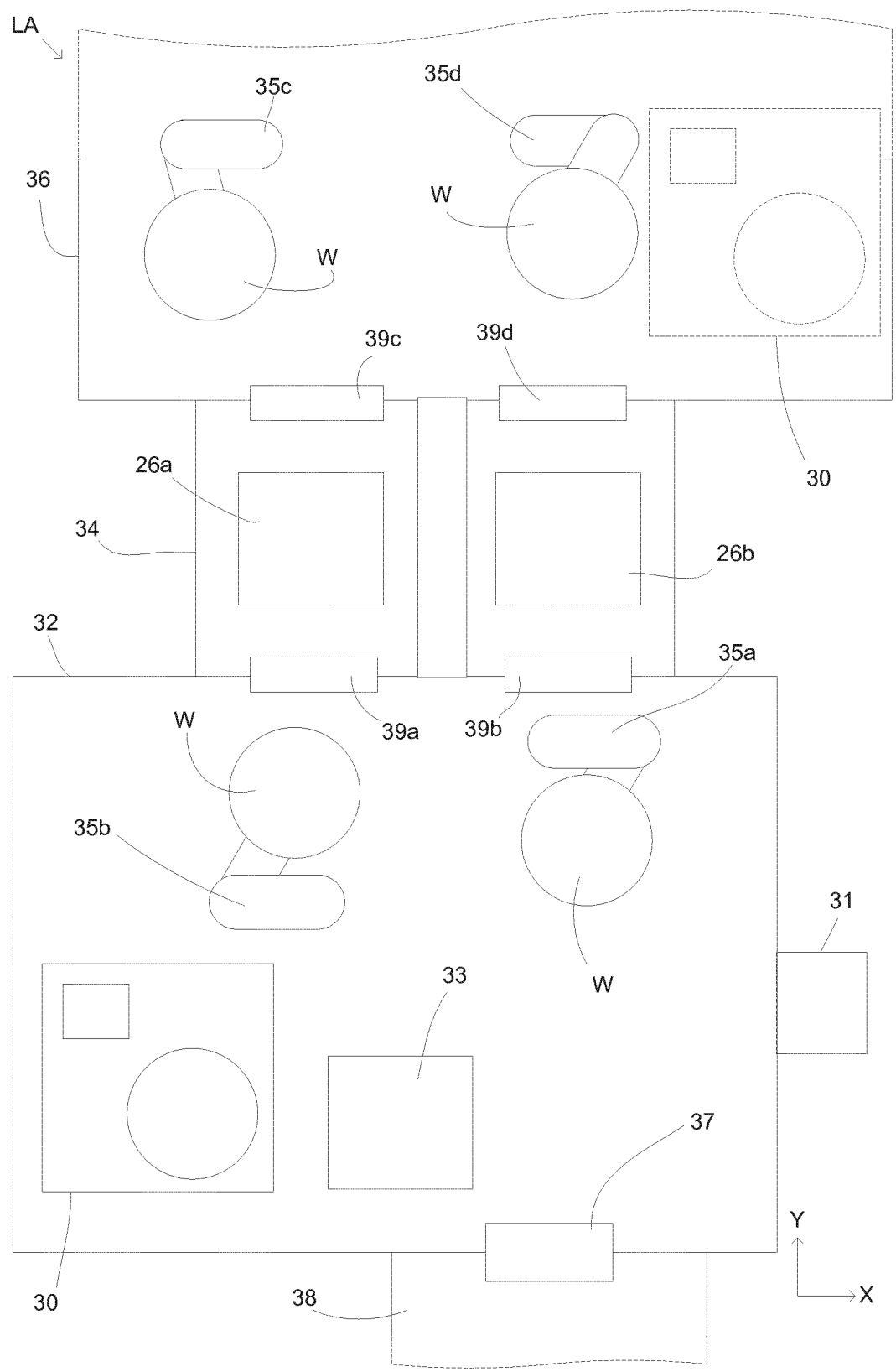
FIG. 3 schematically depicts a view from above a portion of a lithographic apparatus having a substrate storage module according to an embodiment of the invention.

One method of reducing the negative effect associated with ambient air interacting with a lithographically exposed substrate before the substrate undergoes resist processing includes providing the lithographic apparatus with a substrate storage module for protecting lithographically exposed substrates from ambient air. FIG. 3 schematically depicts a view from above a portion of a lithographic apparatus LA having a substrate storage module 30 according to an embodiment of the invention. The portion of the lithographic apparatus LA comprises an atmospheric substrate handling module 32, a transition substrate handling module 34 and a vacuum substrate handling module 36. The atmospheric module 32 is configured to receive substrates W from a substrate carrier 31 under cleanroom conditions (i.e. in ambient air having a controlled level of contaminants) and transfer the substrates W to the transition module 34. The transition module 34 is configured to receive a substrate W from the atmospheric module 32 under atmospheric conditions, generate a vacuum environment, and provide the substrate W to the vacuum module 36. The transition module 34 comprises doors 39a-d that are configured to form a seal when the transition module 34 converts its internal environment from atmospheric conditions to vacuum conditions and vice versa. The transition module 34 comprises stages 26a-b configured to hold substrates whilst the transition between atmospheric conditions and vacuum conditions takes place. The vacuum module 36 is configured to hold the substrate W under vacuum conditions whilst the substrate W is used in the lithographic apparatus LA (e.g. during measurement of the substrate and/or during lithographic exposure of the substrate).

The atmospheric module 32 may comprise a substrate measurement stage 33 that is configured to measure characteristics such as, for example, a position and/or a temperature of a substrate that is located on the substrate measurement stage 33. The atmospheric module 32 may comprise a track interface 37. The track interface 37 may be configured to provide an entrance to and/or exit from a resist processing apparatus 38 (which may also be referred to as a track). The resist processing apparatus 38 may, for example, be configured to receive lithographically exposed substrates W and perform a baking process on the substrates. Additionally or alternatively the resist processing apparatus 38 may be configured to coat substrates W with a layer of resist and provide the substrates to the lithographic apparatus LA for a lithographic exposure. The atmospheric module 32 may comprise one or more robotic arms 35a-b that may be configured to provide substrates W to and/or receive substrates from the substrate carrier 31, the substrate storage module 30, the transition module 34 and the resist processing apparatus 38. The robotic arms 35a-b may be configured to move substrates W between different parts of the atmospheric module 32 (e.g. moving substrates W between the substrate measurement stage 33 and the track interface 37).

The substrate storage module 30 is an integral part of the lithographic apparatus LA. That is, the substrate storage module 30 remains connected to the lithographic apparatus LA throughout operation of the lithographic apparatus LA (i.e. the substrate storage module 30 cannot be removed from the lithographic apparatus LA unless the lithographic apparatus is switched off). This is because the substrate storage module is amongst components of the lithographic apparatus (e.g. robotic arms) and it may not be safe to attempt to access the substrate storage module during operation of the lithographic apparatus. In the example of FIG. 3, the substrate storage module 30 is an integral part of the atmospheric module 32. The substrate storage module 30 may be an integral part of the transition module 34, the vacuum module 36 or any other part of the lithographic apparatus LA. When the substrate storage module 30 is an integral part of the atmospheric module 32, the substrate storage module 30 may be provided with a gas delivery system configured to provide gas having a desired chemical composition and humidity. When the substrate storage module 30 is an integral part of the vacuum module 34, the substrate storage module 30 may be provided with a gas delivery system configured to provide gas having a desired chemical composition and humidity, or the substrate storage module 30 may be held under vacuum conditions along with the vacuum module 36. When the substrate storage module 30 is an integral part of the vacuum module 34 and the substrate storage module 30 comprises a gas delivery system, then the substrate storage module may also comprise a door (e.g. an airlock) configured to seal the internal environment of the substrate storage module such that gas does not escape into the vacuum module 34. In contrast, the substrate carrier 31 is not an integral part of the lithographic apparatus LA because the substrate carrier 31 is temporarily connected to an external part of the lithographic apparatus LA and is configured to be easily attached and detached from the lithographic apparatus LA during operation of the lithographic apparatus LA.

The substrate carrier 31 may, for example, comprise a front opening unified pod (FOUP). FOUPs are used to transport substrates between lithographic apparatus and resist processing apparatus. The internal environment of a FOUP 31 typically comprises ambient air. Ambient air is also present in the internal environment of the atmospheric module 32. Whilst the ambient air present in the substrate carrier 31 and the atmospheric module 32 may be filtered and/or otherwise "cleaned" to a cleanroom specification, the ambient air may still have a negative effect on substrates that have undergone a lithographic exposure but are yet to undergo a baking process. The negative effects caused to lithographically exposed substrates by the ambient air may be due to, for example, undesirable humidity levels and/or an undesirable chemical composition (e.g. an undesirable concentration of amines) of the ambient air. In contrast, the substrate storage module 30 may comprise a controllable environment for protecting lithographically exposed substrates from ambient air. For example, the temperature, the humidity and/or the concentration of amines present in a gas provided to the substrate storage module 30 may be controlled. Alternatively, the substrate storage module 30 may be held under vacuum conditions so as to protect stored substrates from ambient air.

Figure 4:
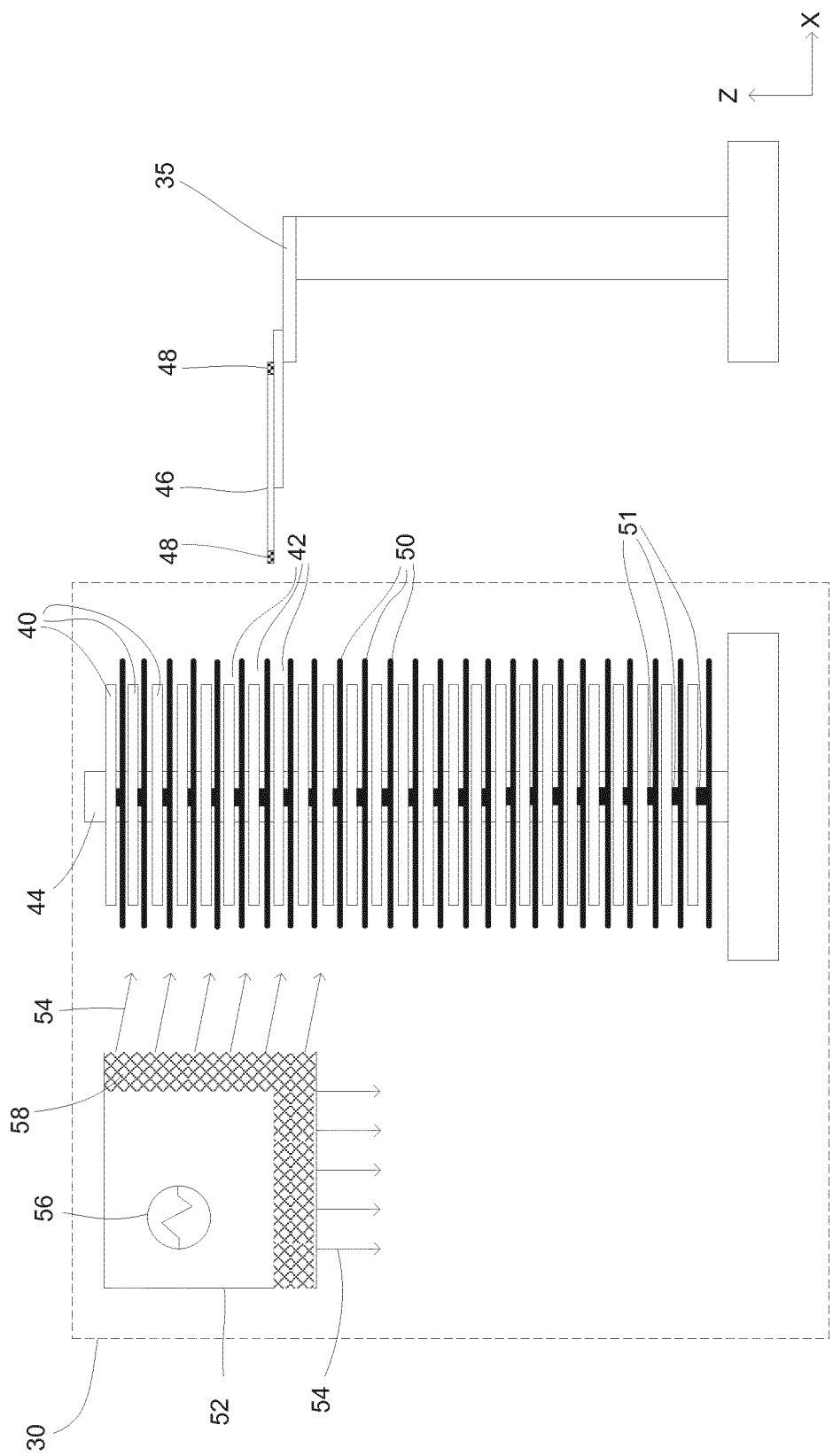
FIG. 4 schematically depicts a view from the front of a substrate storage module according to an embodiment of the invention.

FIG. 4 schematically depicts a view from the front of a substrate storage module 30 according to an embodiment of the invention. The substrate storage module 30 is configured to store at least twenty substrates 40. In the example of FIG. 4, the substrate storage module is configured to hold twenty-five substrates 40. The substrate storage module 30 comprises a plurality of slots 42 for receiving substrates 40. The slots 42 are stacked in a single column 44. In the example of FIG. 4, the substrate storage module 30 is an integral part of the atmospheric module (not shown). A robotic arm 35 of the atmospheric module is configured to receive an incoming substrate (e.g. from the vacuum module) and place the incoming substrate in the substrate storage module 30. The robotic arm 35 is also configured to retrieve an outgoing substrate from the substrate storage module 30 and remove the outgoing substrate from the substrate storage module 30. For example, the robotic arm 35 may move along the z direction (e.g. vertically) until the robotic arm 35 is at the same height as a selected slot 42. The robotic arm 35 may, for example, have a range of movement along the z direction of between about 300 mm and about 500 mm. The robotic arm 35 may then move along the x direction and/or the y direction and retrieve a substrate 40 from the selected slot 42 by attaching the substrate 40 to a substrate platform 46 using an attachment mechanism 48. The robotic arm 35 may, for example, have a range of movement along the x direction and/or along the y direction of between about 300 mm and about 500 mm. The robotic arm 35 may then move the substrate 40 to, for example, the transition module 34 (see FIG. 3) in preparation for a lithographic exposure in the vacuum module 36.

The attachment mechanism 48 may, for example, comprise one or more suction cups or a mechanical or electrostatic clamp. Alternatively, the attachment mechanism 48 may comprise a material having a suitably high friction coefficient for attaching a substrate to the substrate platform 46 when in contact with the substrate, e.g. Viton®. In the example of FIG. 4, the attachment mechanism 48 comprises two suction cups proximate an edge of the substrate platform 46. The suction cups 48 are configured to act on a lower surface of the substrate. The form of the attachment mechanism 48 may depend upon an environment in which the robotic arm 35 is configured to operate. For example, if the robotic arm 35 is configured to operate under cleanroom conditions (e.g. in the atmospheric module) then the attachment mechanism 48 may comprise a mechanical clamp or a suction cup. Alternatively, if the robotic arm 35 is configured to operate under vacuum conditions (e.g. in the vacuum module) then the attachment mechanism 48 may comprise an electrostatic clamp.

The substrate storage module 30 comprises a shield 50 located between neighboring slots 42. The shield 50 may, for example, comprise a sheet of metal. In the example of FIG. 4, the substrate storage module 30 comprises a shield 50 between every neighboring slot 42. The slots 42 are defined by gaps between neighboring shields 50. The shield 50 acts as a physical barrier which reduces the amount of debris transferring between stored substrates 40. For example, when the robotic arm 35 places a substrate 40 in a slot 42 and/or retrieves a substrate 40 from a slot 42, some debris may be generated. The shield 50 reduces the amount of debris that can reach other substrates 40 stored in the substrate storage module 30 (e.g. the shield prevents debris from falling onto lower stored substrates). In the example of FIG. 4, the shields 50 are provided with projections 51 which extend upwardly from a central region of an upper surface of the shields 50 and are configured to support stored substrates 40. The robotic arm 35 may be configured to place a substrate 40 on a projection 51 of a shield 50 such that the substrate 40 is supported by the projection 51 when the substrate 40 is stored in the substrate storage module 30. The projections 51 may, for example, be cylindrical in shape having a flat upper surface upon which a substrate may be placed. The projections 51 may be other shapes. The flat upper surface of the projections 51 may, for example, have a surface area in the range of between about 700 mm$^2$ and about 4000 mm$^2$. The flat upper surface of the projections 51 may have a greater or smaller surface area. Decreasing the surface area of the flat upper surface of the projections 51 may reduce a stability of the substrate when supported by the projections 51. A unit height of the column 44 (i.e. the combined height of a shield 50, a projection 51, and slot 42) may, for example, be in range of about 15 mm to about 30 mm.

The substrate storage module 30 may comprise a gas delivery system 52. The gas delivery system 52 may operate in a similar manner to an air shower by providing a continuous flow of gas 54 within the substrate storage module 30. The direction of the flow of gas 54 may be selected relative to the stored substrates 40 so as to provide a flow of gas across an exposure surface of each substrate 40 stored in the substrate storage module 30. The gas delivery system 52 may comprise a filter 58, such as a HEPA filter and/or a charcoal filter, configured to reduce the amount of unwanted particulate matter and/or chemicals present in the flow of gas 54. The filter 58 may be configured to provide a flow of gas having controlled concentrations of contaminant particles of different sizes. That is, the level of contaminants present in the flow of gas may be controlled by the filter 58 such that the flow of gas satisfies a desired standardized cleanroom specification. The gas delivery system 52 further comprises a heat exchanger 56. The heat exchanger 56 is configured to control a temperature of the gas 54. The heat exchanger 56 may exchange heat energy with the flowing gas 54 so as to keep the temperature of the substrate storage module between about 20° C. and about 25° C., e.g. about 22° C. The gas delivered to the substrate storage module 30 via the gas delivery system 52 may have a desired chemical composition and/or humidity. The gas provided to the substrate storage module 30 may comprise a controlled level of amines, e.g. a concentration of less than one part per million amines.

Figure 5:
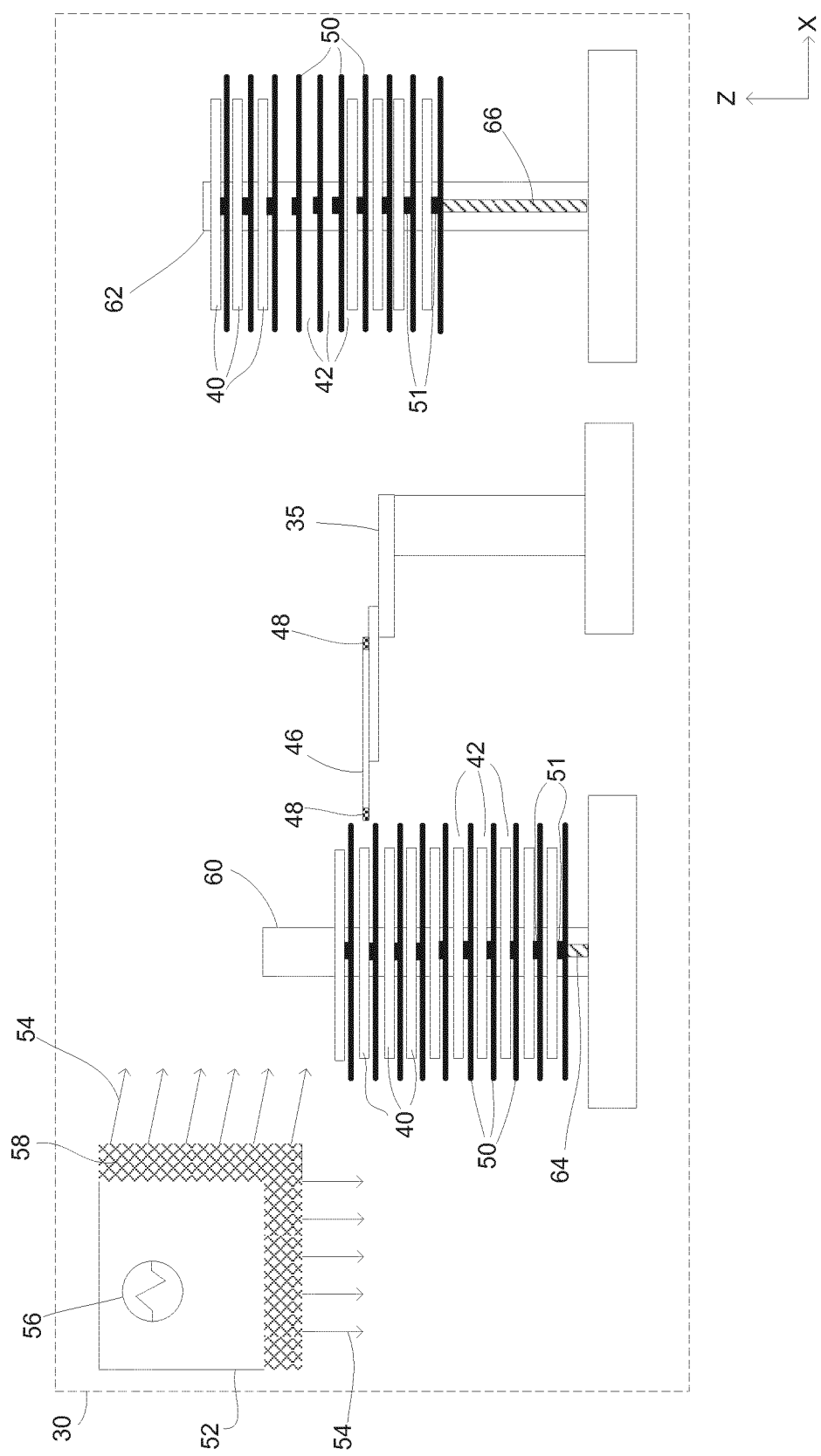
FIG. 5 schematically depicts a view from the front of another substrate storage module according to an embodiment of the invention.

FIG. 5 schematically depicts a view from the front of another substrate storage module 30 according to an embodiment of the invention. In the example of FIG. 5, the substrate storage module 30 is configured to hold twenty substrates 40. The substrate storage module 30 may be configured to hold a greater number of substrates. The substrate storage module 30 comprises a plurality of slots 42 for receiving substrates 40. The slots 42 are stacked in two columns 60, 62. In the example of FIG. 5, each column 60, 62 is configured to hold ten substrates 40. The columns 60, 62 may be configured to hold a greater or smaller number of substrates 40. Each column 60, 62 may, for example, have a height in the range of between about 200 mm and about 500 mm Stacking the slots 42 across multiple columns reduces a total height of the substrate storage module 30 compared to only stocking the slots 42 in a single column. Reducing the total height of the substrate storage module 30 may be desirable when seeking to install the substrate storage module 30 in a lithographic apparatus that has limited available space in the z-direction.

In the example of FIG. 5, the substrate storage module 30 is an integral part of the atmospheric module (not shown). The substrate storage module 30 comprises a robotic arm 35 configured to receive an incoming substrate 40 (e.g. from the vacuum module) and place the incoming substrate 40 in the substrate storage module 30. The robotic arm 35 is also configured to retrieve an outgoing substrate 40 from the substrate storage module 30 and remove the outgoing substrate 40 from the substrate storage module 30. For example, the robotic arm 35 may retrieve a partially exposed substrate 40 that has undergone a first sub-exposure from the transition module (not shown) and move the partially exposed substrate 40 along the z direction until the robotic arm 35 is at the same height as a desired slot 42 of a desired column 60, 62. The robotic arm 35 may then move along the x direction and/or the y direction and place the partially exposed substrate 40 in a selected slot 42 by disengaging the attachment mechanism 48. The substrate 40 may be stored in the substrate storage module 30 until other substrates 40 have undergone the first set of sub-exposures and it is time for the second set of sub-exposures to take place. The robotic arm 35 may then attach the partially exposed substrate 40 to the substrate platform 46 by engaging the attachment mechanism 48 and move the partially exposed substrate 40 to, for example, the transition module (not shown) in preparation for the second set of sub-exposures in the vacuum module (not shown).

The substrate storage module 30 comprises shields 50 between neighboring slots 42. The shields 50 are configured to reduce the amount of debris transferring between stored substrates 40. In the example of FIG. 5, the shields 50 are provided with projections 51 upon which a substrate 40 may be placed. The robotic arm 35 may be configured to place a substrate 40 on a flat upper surface of a projection 51 such that the substrate 40 is supported by the projection 51 when the substrate 40 is stored in the substrate storage module 30.

The substrate storage module 30 comprises a gas delivery system 52 that may be the same as the gas delivery system shown in FIG. 4. That is, the gas delivery system 52 may comprise a filter 58 and a heat exchanger 56, and is configured to provide a flow of gas 54 within the substrate storage module 30. The gas delivered to the substrate storage module 30 via the gas delivery system 52 may have a desired temperature, chemical composition and/or humidity.

In the example of FIG. 5, the substrate storage module 30 further comprises actuators 64, 66 configured to move the positions of the slots 42. Each column of slots comprises its own actuator 64, 66. In the example of FIG. 5, the actuators comprise moveable rods 62, 64 configured to move the slots 42 along the z direction. The actuator 64, 66 may reduce the extent of movement required of the robotic arm 35 and relative movement between the robotic arm 35 and the slots 42 using the actuator 64, 66 may reduce the time required to retrieve substrates 40 from and/or place substrates in the substrate storage module 30. The actuators 62, 64 may, for example, have a range of movement along the z direction of between about 200 mm and about 500 mm. The example embodiments of the substrate storage module depicted in FIGS. 4 and 5 may be an integral part of the vacuum system 34 (see FIG. 3).

Figure 6:
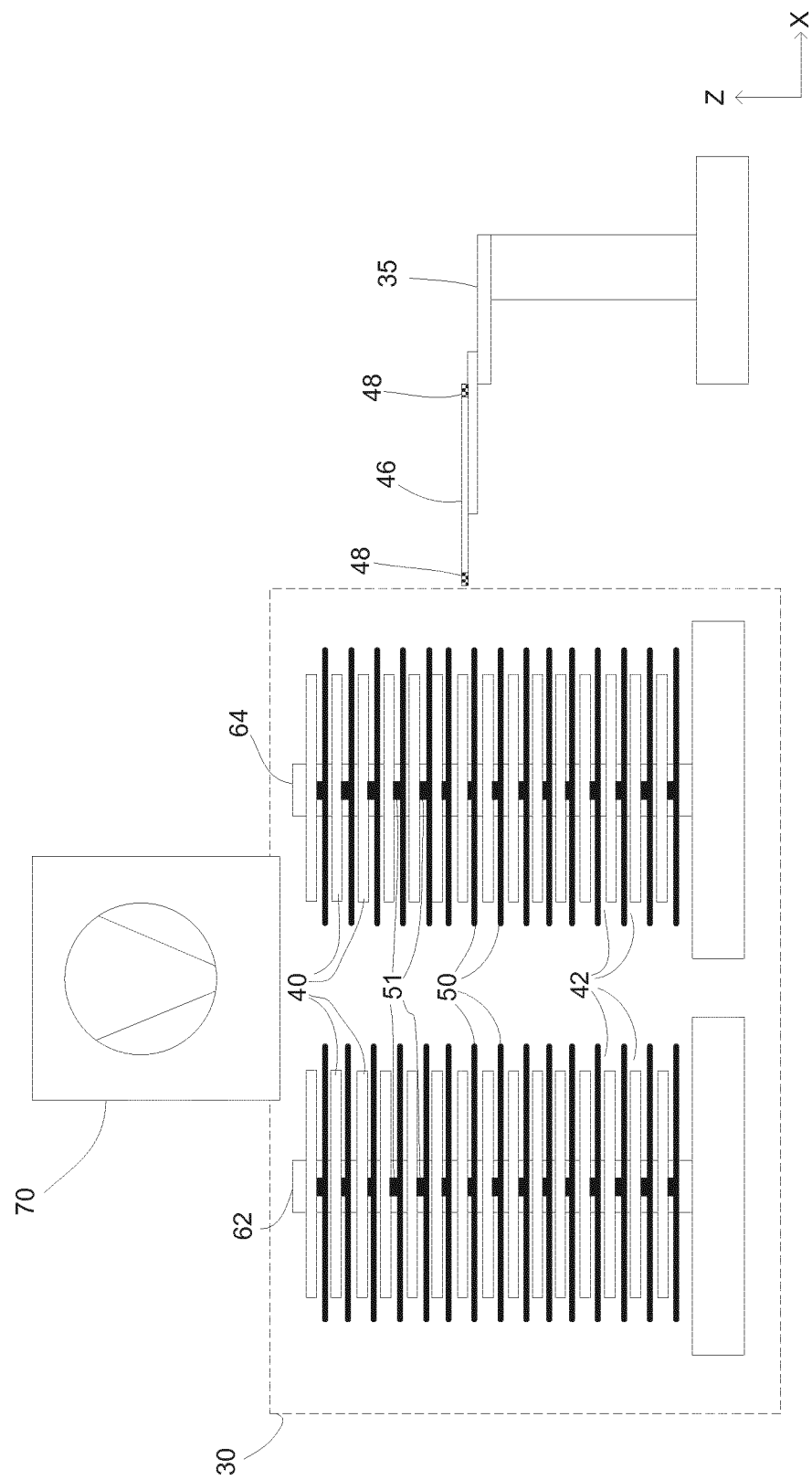
FIG. 6 schematically depicts a view from the front of yet another substrate storage module according to an embodiment of the invention; and, FIG. 7 shows a flow chart of a method of exposing a plurality of substrates to form a stitched pattern on the substrates according to an embodiment of the invention.

FIG. 6 schematically depicts a view from the front of yet another substrate storage module 30 according to an embodiment of the invention. In the example of FIG. 6, the substrate storage module 30 is configured to hold thirty substrates 40. The substrate storage module 30 comprises a plurality of slots 42 for receiving substrates 40. The slots 42 are stacked in two columns 60, 62. In the example of FIG. 6 the columns 62, 64 both have the same number of slots 42 (i.e. 15 slots each). The substrate storage module 30 comprises shields 50 between neighboring slots 42, the shields 50 being configured to reduce the amount of debris transferring between stored substrates 40. In the example of FIG. 6, the shields 50 are provided with projections 51 upon which a substrate 40 may be placed. The robotic arm 35 may be configured to place a substrate 40 on a flat upper surface of a projection 51 such that the substrate 40 is supported by the projection 51 when the substrate 40 is stored in the substrate storage module 30.

In the example of FIG. 6, the substrate storage module 30 is an integral part of the vacuum module 36 (see FIG. 3). The vacuum module comprises a vacuum system 70 configured to generate a vacuum within the vacuum module 36 (see FIG. 3). The vacuum system 70 may also be configured to generate a vacuum environment in the substrate storage module 30. Alternatively, the substrate storage module 30 may comprise its own vacuum system. Generating a vacuum in the substrate storage module 30 protects the stored substrates 40 from negative effects associated with interactions between the substrates 40 and ambient air.

A robotic arm 35 of the vacuum storage module may be configured to receive an incoming substrate 40 and place the incoming substrate 40 in the substrate storage module 30. For example, the robotic arm 35 may retrieve a substrate 40 from a substrate table (not shown) within the vacuum module 36 (see FIG. 3) after the substrate 40 has undergone a first set of sub-exposures. The substrate 40 may be stored in the substrate storage module 30 until other substrates 40 have undergone the first set of sub-exposures and it is time for the second set of sub-exposures to take place (e.g. exposure of the lot of substrates has been completed). The robotic arm 35 may also configured to retrieve an outgoing substrate 40 from the substrate storage module 30. For example, the robotic arm 35 may retrieve a substrate 40 that has undergone a first set of sub-exposures from the transition module (not shown) and move the substrate 40 to the substrate table of the vacuum module in preparation for a second set of sub-exposures. The robotic arm 35 attaches the substrate 40 to the substrate platform 46 by engaging the attachment mechanism 48 and detaches the substrate 40 from the substrate platform 46 by disengaging the attachment mechanism 48. In the example of FIG. 6, the attachment mechanism 48 comprises electrostatic clamps.

Figure 7:
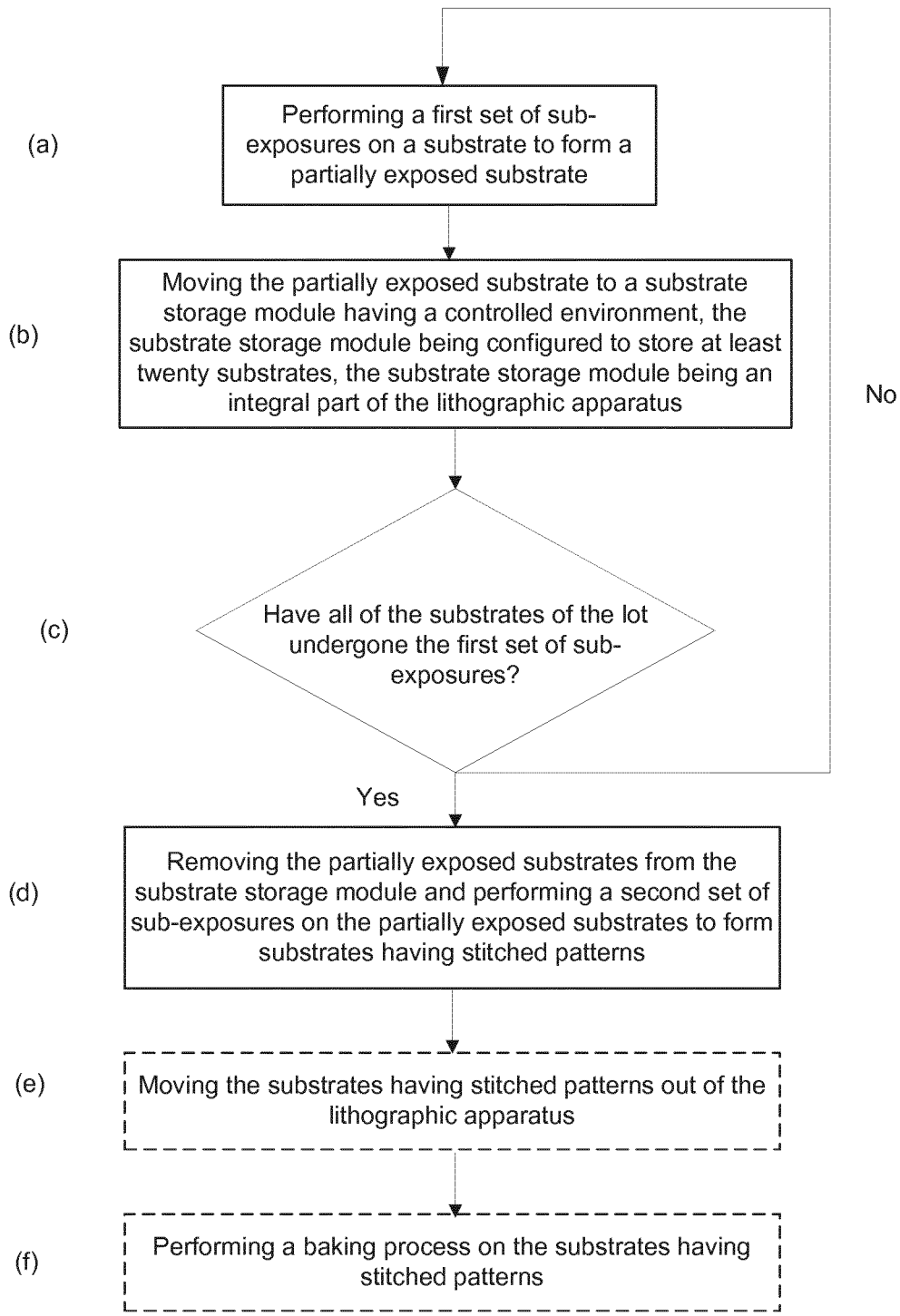

FIG. 7 is a flow chart showing a method of exposing a plurality of substrates to form a stitched pattern on the substrates according to an embodiment of the invention. A first step (a) of the method comprises performing a first set of sub-exposures on a substrate to form a partially exposed substrate. For example, with reference to FIG. 3, a substrate W may be retrieved from a substrate carrier 31 by a robotic arm 35a and placed on a substrate measurement stage 33. Characteristics such as, for example, a position and/or a temperature of the substrate may be measured by the substrate measurement stage 33. A robotic arm 35b may then retrieve the substrate W from the substrate measurement stage 33 and place the substrate in the transition module 34. The transition module 34 may generate a vacuum environment before a robotic arm 35c in the vacuum module 36 retrieves the substrate W from the transition module 34. In the case of a dual stage lithographic apparatus, the robotic arm 35c may then place the substrate W on a substrate table on a measurement stage (not shown) within the vacuum module. The measurement stage may be configured to measure characteristics of the substrate W such as, for example, positions of alignment features of the substrate and/or a topography of the substrate. A robotic arm 35d may then swap the substrate table from the measurement stage with a substrate table from an exposure stage, such as the substrate table WT depicted in FIG. 1. The first set of sub-exposures may then take place whilst the substrate W is held by the substrate table.

Referring again to FIG. 7, a second step (b) of the method comprises moving the partially exposed substrate to a substrate storage module having a controlled environment. For example, with reference to FIG. 3, a robotic arm 35d may retrieve the partially exposed substrate from the substrate table (not shown) and place the partially exposed substrate in the transition module 34. The transition module 34 may then replace the vacuum environment with an ambient environment. A robotic arm 35a may then retrieve the partially exposed substrate from the transition module 34 and place the partially exposed substrate in a slot of the substrate storage module 30. The substrate storage module 30 may be configured to store at least twenty substrates. The substrate storage module 30 is an integral part of the lithographic apparatus. Alternatively, the substrate storage module 30 may be an integral part of the vacuum module 36 (see FIG. 3).

Referring again to FIG. 7, a third step (c) of the method comprises repeating the first step (a) and the second step (b) for the remaining substrates. That is, subsequent substrates undergo the first set of sub-exposures to become partially exposed substrates before being moved into the substrate storage module for protection from ambient air. Steps (a) and (b) may be repeated for substrates of the lot which have not yet undergone the first set of sub-exposures. A fourth step (d) of the method comprises removing the partially exposed substrates from the substrate storage module and performing a second set of sub-exposures on the partially exposed substrates to form substrates having stitched patterns. The second set of sub-exposures takes place using a different patterning device, or a different part of the same patterning device. That is, the pattern imparted to the substrate in the second set of sub-exposures is different to the pattern imparted to the substrate in the first set of sub-exposures. For example, with reference to FIG. 3, a partially exposed substrate may be retrieved from the substrate storage module 30 by a robotic arm 35b and placed in the transition module 34. The transition module 34 may generate a vacuum environment before a robotic arm 35c in the vacuum module 36 retrieves the partially exposed substrate from the transition module 34. In the case of a dual stage lithographic apparatus, the robotic arm 35c may then place the partially exposed substrate on a substrate table on a measurement stage (not shown) within the vacuum module 36. The measurement stage may be configured to measure characteristics of the partially exposed substrate. A robotic arm 35d may then swap the substrate table from the measurement stage with a substrate table from an exposure stage, such as the substrate table WT depicted in FIG. 1. The second set of sub-exposures may then take place to form a substrate having a stitched pattern.

Referring again to FIG. 7, an optional fifth step of the method comprises moving the substrates having stitched patterns out of the lithographic apparatus. An optional sixth step (f) of the method comprises performing a baking process on the substrates having stitched patterns. For example, with reference to FIG. 3, a substrate having a stitched pattern may be moved by robotic arms 35a-d from the vacuum module 36, through the transition module 34 and placed on the track interface 37 in the atmospheric module 32. A robotic arm (not shown) in the resist processing apparatus 38 may retrieve the substrate having a stitched pattern from the track interface 37 and place the substrate in the resist processing apparatus such that a baking process may be performed on the substrate. Alternatively, if the resist processing apparatus 38 is unavailable, the substrates having a stitched pattern may be returned to the substrate storage module 30 for protection from ambient air until they are able to undergo resist processing. In contrast, the substrate carrier 31 would hold the substrates in ambient air.

The substrate storage module is configured to hold at least twenty substrates. The substrate storage module may be capable of holding an entire lot of substrates (e.g. about twenty-five substrates). The substrate storage module may be capable of containing a greater or smaller number of substrates. For example, the substrate storage module may be configured to hold twenty-three substrates. This is because, whilst there are twenty-five substrates in a lot, one or more substrates may be outside the substrate storage module interacting with other parts of the lithographic apparatus, e.g. being moved by a robotic arm or being measured on a measurement stage. In this case, the substrate storage module may assist in the stitched exposure of the entire lot of substrates whilst having capacity for less than the entire lot of substrates. The substrate storage module may be configured to store more than one lot of substrates so that some slots are available for different types of substrate. For example, the substrate storage module of FIG. 6 can hold an entire lot of substrates (i.e. twenty-five substrates) whilst also having spare slots that are available for storing substrates that are configured to assist in cleaning and maintenance of the lithographic apparatus. Alternatively or additionally, slots in the substrate storage module may be available for storing substrates that are configured to assist in calibrating the lithographic apparatus. As a further alternative or addition, slots in the substrate storage module may be available for substrates that are configured to perform in-situ measurements of internal conditions of the lithographic apparatus e.g. substrates configured to measure a temperature or pressure of the environment within lithographic apparatus. The substrate storage module may be formed from materials such as, for example, metals, polycarbonate and/or carbon-filled polyether ether ketone.

The substrate storage module may comprise a door and a mechanism configured to actuate the door. For example, when the substrate storage module has its own vacuum system, the substrate storage module may be provided with a door configured to form a vacuum seal in order to maintain the vacuum of the substrate storage module.

The substrate storage module may comprise a temperature sensor. The temperature sensor may form part of a feedback loop. For example, data output by the temperature sensor may be provided to a processor. The processor may determine whether or not the temperature of the substrate storage module is at a desired value. If the temperature of the substrate storage module is not at a desired value then the processor may provide a signal to a heat exchanger in order to heat or cool the substrate storage module. The substrate storage module may comprise a humidity sensor. The substrate storage module may comprise a chemical analyser configured to determine the presence and/or abundance of a chemical or group of chemicals such as, for example, amines in the substrate storage module.

The substrate storage module may comprise one or more position sensors (e.g. optical sensors) that are configured to detect a position of a substrate when the substrate is held by the substrate storage module. The substrate storage module may comprise one or more sensors that are configured to determine whether or not slots in the substrate storage module are occupied by a substrate. For example, with reference to FIG. 5, each shield 50 and/or projection 51 may be provided with one or more sensors (not shown) such as a pressure sensor or an optical sensor configured to determine whether or not a slot is occupied by a substrate 40. The sensor may, for example, provide a signal that is indicative of whether or not a slot 42 is occupied by a substrate 40 to a processor (not shown). The processor may be configured to receive the signal from the sensor and control movement of the robotic arm 35 in dependence on the signal received from the sensor such that the robotic arm 35 only places incoming substrates in unoccupied slots 42.

Whilst the use of a lithographic apparatus comprising a substrate storage module has been described in the context of storing substrates that are to undergo a stitched lithographic exposure, the lithographic apparatus comprising the substrate storage module may be used for other types of lithographic exposure. For example, the substrates storage module may be used to store singly exposed substrates until a resist processing apparatus is ready to receive the singly exposed substrates.

In an embodiment, the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed. The substrate storage module may, for example, be used to store lithographically exposed substrates in a controlled environment before the substrates are provided to the metrology apparatus for measurement. As another example, substrates configured for calibrating the metrology apparatus may be stored in the substrate storage module for quick access when needed.

Although specific reference may be made in this text to embodiments of the invention in the context of a lithographic apparatus, embodiments of the invention may be used in other apparatus. Embodiments of the invention may form part of a metrology apparatus, or any apparatus that measures or processes an object such as a wafer (or other substrate). These apparatus may be generally referred to as lithographic tools. Such a lithographic tool may use vacuum conditions or ambient (non-vacuum) conditions whilst the substrate storage module comprises a controlled environment which protects substrates from ambient air.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although FIG. 1 depicts the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Clauses

1. A lithographic apparatus comprising a substrate storage module having a controllable environment for protecting lithographically exposed substrates from ambient air, the substrate storage module being configured to store at least twenty substrates, wherein the substrate storage module is an integral part of the lithographic apparatus.

2. The lithographic apparatus of clause 1, wherein the substrate storage module comprises a gas delivery system configured to provide a flow of gas within the substrate storage module.

3. The lithographic apparatus of clause 2, wherein the gas delivery system comprises a filter.

4. The lithographic apparatus of clause 2 or clause 3, wherein the gas delivery system comprises a heat exchanger.

5. The lithographic apparatus of clause 1, further comprising a vacuum system configured to generate a vacuum within the substrate storage module.

6. The lithographic apparatus of any preceding clause, wherein the substrate storage module comprises a plurality of slots for receiving substrates.

7. The lithographic apparatus of clause 6, wherein the slots are stacked in a plurality of columns.

8. The lithographic apparatus of clause 6 or clause 7, wherein the substrate storage module comprises a shield located between neighboring slots, the shield being configured to reduce the amount of debris transferring between stored substrates.

9. The lithographic apparatus of any of clauses 6 to 8, wherein the substrate storage module comprises an actuator configured to move the slots.

10. The lithographic apparatus of any preceding clause, further comprising a robotic arm configured to receive an incoming substrate and place the incoming substrate in the substrate storage module, the robotic arm being further configured to retrieve an outgoing substrate from the substrate storage module and remove the outgoing substrate from the substrate storage module.

11. A lithographic apparatus comprising: an illumination system configured to condition a radiation beam; a support structure constructed to support a patterning device, the patterning device being capable of imparting the radiation beam with a pattern in its cross-section to form a patterned radiation beam; a substrate table constructed to hold a substrate; a projection system configured to project the patterned radiation beam onto the substrate; and, a substrate storage module having a controllable environment for protecting lithographically exposed substrates from ambient air, the substrate storage module being configured to store at least twenty substrates, wherein the substrate storage module is an integral part of the lithographic apparatus.

12. A method of exposing a plurality of substrates to form a stitched pattern on the substrates, the method comprising the following steps: performing a first set of sub-exposures on a substrate to form a partially exposed substrate; (b) moving the partially exposed substrate to a substrate storage module having a controlled environment, the substrate storage module being configured to store at least twenty substrates, the substrate storage module being an integral part of the lithographic apparatus; (c) repeating steps (a) and (b) for the remaining substrates; and, (d) removing the partially exposed substrates from the substrate storage module and performing a second set of sub-exposures on the partially exposed substrates to form substrates having stitched patterns.

13. The method of clause 12, further comprising the following step: (e) performing a baking process on the substrates having stitched patterns.

14. The method of clause 12 or clause 13, further comprising providing a flow of gas within the substrate storage module.

15. The method of clause 14, further comprising filtering the flow of gas.

16. The method of clause 14 or clause 15, further comprising controlling a temperature of the gas.

17. The method of any of clauses 14 to 16, further comprising controlling a humidity of the gas.

18. The method of any of clauses 14 to 17, further comprising controlling a concentration of amines in the gas.

19. The method of clause 12 or clause 13, further comprising generating a vacuum within the substrate storage module.

20. A device manufactured according to the method of any of clauses 12 to 19.

The invention claimed is:

1. A substrate storage module comprising:
a gas delivery system configured to provide a flow of gas within the substrate storage module and to provide a controllable environment for protecting lithographic substrates from ambient air,
wherein the substrate storage module is configured to store at least twenty lithographic substrates,
wherein the substrate storage module is configured to be an integral part of a lithographic apparatus in use,
wherein the lithographic apparatus comprises a vacuum substrate handling module, an atmospheric substrate handling module, and a transition substrate handling module disposed between the vacuum substrate handling module and the atmospheric substrate handling module, and wherein the substrate storage module is located in the atmospheric substrate handling module.

2. The module of claim 1, wherein the gas delivery system comprises a filter.

3. The module of claim 1 wherein the gas delivery system comprises a heat exchanger.

4. The module of claim 1, further comprising a vacuum system configured to generate a vacuum within the substrate storage module.

5. The module of claim 1, wherein the substrate storage module comprises a plurality of slots for receiving lithographic substrates.

6. The module of claim 5, wherein the slots are stacked in a plurality of columns.

7. The module of claim 5, wherein the substrate storage module comprises a shield located between neighboring slots, the shield being configured to reduce the amount of debris transferring between stored lithographic substrates.

8. The module of claim 5, wherein the substrate storage module comprises an actuator configured to move the slots.

9. The module of claim 1, further comprising a robotic arm configured to receive an incoming lithographic substrate and place the incoming substrate in the substrate storage module, the robotic arm being further configured to retrieve an outgoing lithographic substrate from the substrate storage module and remove the outgoing substrate from the substrate storage module.

10. A lithographic apparatus comprising:
an illumination system configured to condition a radiation beam;
a support structure constructed to support a patterning device, the patterning device being capable of imparting the radiation beam with a pattern in its cross-section to form a patterned radiation beam;
a substrate table constructed to hold a lithographic substrate;
a projection system configured to project the patterned radiation beam onto the lithographic substrate;
a substrate storage module having a controllable environment configured to protect a plurality of lithographic substrates from ambient air, the substrate storage module being configured to store at least twenty lithographic substrates, wherein the substrate storage module is an integral part of the lithographic apparatus; and
a vacuum substrate handling module, an atmospheric substrate handling module, and a transition substrate handling module disposed between the vacuum substrate handling module and the atmospheric substrate handling module, wherein the substrate storage module is located in the atmospheric substrate handling module.

11. A method of exposing a plurality of lithographic substrates using a lithographic apparatus to form a stitched pattern on the substrates, the method comprising:
performing a first set of sub-exposures on the lithographic substrates to form partially exposed lithographic substrates;
moving the partially exposed lithographic substrates to a substrate storage module having a controlled environment, the substrate storage module being configured to store at least twenty of the lithographic substrates, the substrate storage module being an integral part of the lithographic apparatus, the lithographic apparatus comprising a vacuum substrate handling module, an atmospheric substrate handling module, and a transition substrate handling module disposed between the vacuum substrate handling module and the atmospheric substrate handling module, and the substrate storage module being located in the atmospheric substrate handling module;
repeating the performing and moving for the remaining substrates; and
removing the partially exposed lithographic substrates from the substrate storage module and performing a second set of sub-exposures on the partially exposed lithographic substrates to form substrates having stitched patterns.

12. The method of claim 11, further comprising:
performing a baking process on the lithographic substrates having stitched patterns.

13. The method of claim 11, further comprising providing a flow of gas within the substrate storage module.

14. The method of claim 13, further comprising filtering the flow of gas.

15. The method of claim 13, further comprising controlling a temperature or/and a humidity of the gas.

16. The method of claim 13, further comprising controlling a concentration of amines in the gas.

17. The method of claim 11, further comprising generating a vacuum within the substrate storage module.

* * * * *